US010394378B2

(12) United States Patent
Huang et al.

(10) Patent No.: US 10,394,378 B2
(45) Date of Patent: Aug. 27, 2019

(54) FLOATING TOUCH DISPLAY APPARATUS

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Weiyun Huang, Beijing (CN); Yue Long, Beijing (CN); Yang Wang, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

( * ) Notice: Subject to any disclaimer, the term of this patent is extended or adjusted under 35 U.S.C. 154(b) by 0 days.

(21) Appl. No.: 15/277,181

(22) Filed: Sep. 27, 2016

(65) Prior Publication Data

US 2017/0115823 A1 Apr. 27, 2017

(30) Foreign Application Priority Data

Oct. 22, 2015 (CN) .......................... 2015 1 0691498

(51) Int. Cl.

*G06F 3/041* (2006.01)
*G06F 3/042* (2006.01)
*H01L 51/50* (2006.01)

(52) U.S. Cl.

CPC .......... *G06F 3/0418* (2013.01); *G06F 3/0412* (2013.01); *G06F 3/0421* (2013.01);
(Continued)

(58) Field of Classification Search

CPC ......... G06F 3/041; G06F 3/0418–0428; G06F 3/0412; G06F 3/0421; G06F 2203/04101;
(Continued)

(56) References Cited

U.S. PATENT DOCUMENTS 7,535,468 B2 * 5/2009 Uy .................... H01L 27/14601 345/104
9,122,349 B1 * 9/2015 Chang ................. G09G 3/3413
(Continued)

FOREIGN PATENT DOCUMENTS

CN 102968220 A 3/2013
CN 104020896 A 9/2014
(Continued)

OTHER PUBLICATIONS

The First Chinese Office Action dated Sep. 25, 2017; Appln. No. 201510691498.5.

(Continued)

*Primary Examiner* — Roberto W Flores
(74) *Attorney, Agent, or Firm* — Ladas & Parry LLP

(57) ABSTRACT

A floating touch display apparatus is provided. The apparatus comprises a display panel and a touch identifying unit. The display panel comprises: a plurality of pixels, each pixel of the display panel including n sub-pixels, and the n sub-pixels respectively emitting light having wavelengths in a first to an n-th wavebands to display and image; a plurality of light-emitting units, each light-emitting unit being configured for emitting light having a wavelength in a (n+1)-th waveband, and wavelength ranges of the light in the first to the (n+1)-th wavebands being not coincide; a plurality of light-receiving units, each light-receiving unit being configured for receiving the light in the (n+1)-th waveband and generating a touch identifying signal. The touch identifying unit identifies a floating touch action according to the touch identifying signal generated by the light-receiving unit.

12 Claims, 6 Drawing Sheets

(52) U.S. Cl.
CPC .. *H01L 51/502* (2013.01); *G06F 2203/04101* (2013.01); *G06F 2203/04108* (2013.01)

(58) Field of Classification Search
CPC ........ G06F 2203/04108; H01L 51/502; G09G 2360/14–148
USPC ..................... 345/173–178; 178/18.01–20.04
See application file for complete search history.

(56) References Cited

U.S. PATENT DOCUMENTS

2004/0174324 A1* 9/2004 Yamazaki ........... G06F 3/03545 345/76
2006/0262055 A1* 11/2006 Takahara .......... H01L 27/14643 345/81
2008/0174530 A1* 7/2008 Booth .................. G09G 3/3208 345/82
2011/0019055 A1* 1/2011 Jaworski ................ G09G 3/001 348/333.01
2011/0102390 A1* 5/2011 Moriwaki ............ G09G 3/3208 345/207
2011/0199351 A1* 8/2011 Kurokawa ........... G09G 3/3648 345/207
2013/0033471 A1* 2/2013 Park ...................... G06F 3/0412 345/207
2013/0050148 A1 2/2013 Jeon et al.
2013/0075692 A1* 3/2013 Naasani ................. B82Y 20/00 257/13
2014/0192023 A1* 7/2014 Hoffman ............... G06F 3/0423 345/175
2014/0231625 A1 8/2014 Chang et al.
2015/0242056 A1* 8/2015 Hoffman ............... G06F 3/0428 345/175
2015/0364107 A1* 12/2015 Sakariya ............... G06F 3/0412 345/174
2016/0328090 A1* 11/2016 Klinghult .............. G06F 3/0428
2016/0342282 A1* 11/2016 Wassvik .............. G02F 1/13338
2017/0025615 A1* 1/2017 Seo ..................... H01L 51/5004

FOREIGN PATENT DOCUMENTS

CN 104707333 A 6/2015
CN 104932760 A 9/2015
WO 2015/108477 A1 7/2015

OTHER PUBLICATIONS

The Second Chinese Office Action dated Apr. 27, 2018: Appln. No. 201510691498.5.
The Third Chinese Office Action dated Sep. 25, 2018; Appln. No. 201510691498.5.

* cited by examiner

FLOATING TOUCH DISPLAY APPARATUS

TECHNICAL FIELD

Embodiments of the present disclosure relate to a floating touch display apparatus.

BACKGROUND

Floating touch is a new touch mode for realizing a touch operation without contacting a touch display apparatus; namely, operations such as clicking, sliding and so on are realized on the touch display apparatus in the case that there is a certain distance (e.g., 15 mm) between a finger of a user and a screen of the touch display apparatus.

The floating touch is generally implemented by manners of capacitive sensitive touch and external infrared sensor. As to the manner of external infrared sensor, an infrared sensor is provided on an outer side of the touch display apparatus, and its principle for realizing the floating touch is that: the infrared sensor emits infrared light at the time of the touch display apparatus displaying an image, the infrared light is reflected by the finger in the case that there is a certain distance between the finger and the screen and is received by the infrared sensor, and a position and a specific action of the finger are determined accordingly. The external infrared sensor may cause the floating touch display apparatus to be bulky, and a number of the external infrared sensors is often insufficient (to avoid affecting normal display) so that the touch accuracy thereof is limited.

As to the manner of capacitive sensitive touch, a sensing capacitor identifies the touch action in the case that the finger is not in contact with the screen by increasing a sensitivity of the sensing capacitor, so as to realize the floating touch. But, in the case that the floating touch is implemented by this manner, it is required that the distance between the finger and the screen should be short, so that the floating touch capability thereof is limited.

SUMMARY

According to embodiments of the disclosure, a floating touch display apparatus is provided. The floating touch display apparatus comprises a display panel and a touch identifying unit. The display panel comprises: a plurality of pixels, each pixel of the display panel including n sub-pixels, and the n sub-pixels respectively emitting light having wavelengths in a first to an n-th wavebands to display and image; a plurality of light-emitting units, wherein each light-emitting unit is configured for emitting light having a wavelength in a (n+1)-th waveband, and wavelength ranges of the light in the first to the (n+1)-th wavebands do not coincide; a plurality of light-receiving units, wherein each light-receiving unit is configured for receiving the light in the (n+1)-th waveband and generating a touch identifying signal. The touch identifying unit identifies a floating touch action according to the touch identifying signal generated by the light-receiving unit.

For example, the light having the wavelength in the (n+1)-th waveband is an invisible light.

For example, the light having the wavelength in the (n+1)-th waveband is an infrared light.

For example, the light-emitting unit includes a first quantum dot, which emits the light in the (n+1)-th waveband upon being irradiated with light or applied with a voltage; the light-receiving unit includes a second quantum dot, which absorbs the light in the (n+1)-th waveband and converts the light to an electrical signal serving as the touch identifying signal; and the touch identifying unit identifies the floating touch action according to the electrical signal.

For example, the first quantum dot and second quantum dot are located in a region corresponding to a black matrix of the display panel.

For example, the floating touch display apparatus is a quantum dot display apparatus; and the first quantum dot and second quantum dot arc provided in a same layer with a quantum dot of the sub-pixel.

For example, the first quantum dot and/or the second quantum dot are located in the sub-pixel.

For example, the light-emitting unit and the light-receiving unit are provided in each pixel.

For example, in the pixel, the light-emitting unit is provided in a region corresponding to the black matrix around at least one sub-pixel, and the light-receiving unit is provided in a region corresponding to the black matrix around at least one sub-pixel; or in the pixel, both the light-emitting unit and the light-receiving unit are provided in a region corresponding to the black matrix around each sub-pixel.

For example, the display panel includes an anode layer, a hole transport layer, a quantum dot layer, an electron transport layer and a cathode layer which are provided sequentially; and the quantum dot layer includes the first quantum dot, the second quantum dot and a quantum dot in each sub-pixel for emitting light in the first to n-th wavebands.

For example, the light-emitting unit and the light-receiving unit are provided in part of the pixels.

For example, the light-emitting unit and the light-receiving unit are not provided in a same pixel.

For example, each light-emitting unit corresponds to several light-receiving units.

For example, each light-receiving unit corresponds to several light-emitting units.

BRIEF DESCRIPTION OF THE DRAWINGS

The drawings are provided for a further understanding of the present disclosure, and constitute a part of the specification; the drawings together with the specific embodiments are used to explain the present disclosure, rather than form a limitation thereto, in which.

DETAILED DESCRIPTION

In order to make the objective, technical solutions, and advantages of the present disclosure clearer, the technical solutions in the embodiments of the present disclosure are described more clearly and completely hereinafter in conjunction with the accompanying drawings. It is obvious that the described embodiments are just a part but not all of the embodiments of the present disclosure. Based on the described embodiments herein, those skilled in the art can obtain other embodiment(s), without any inventive work, which should be within the scope of the present disclosure.

Figure 1:
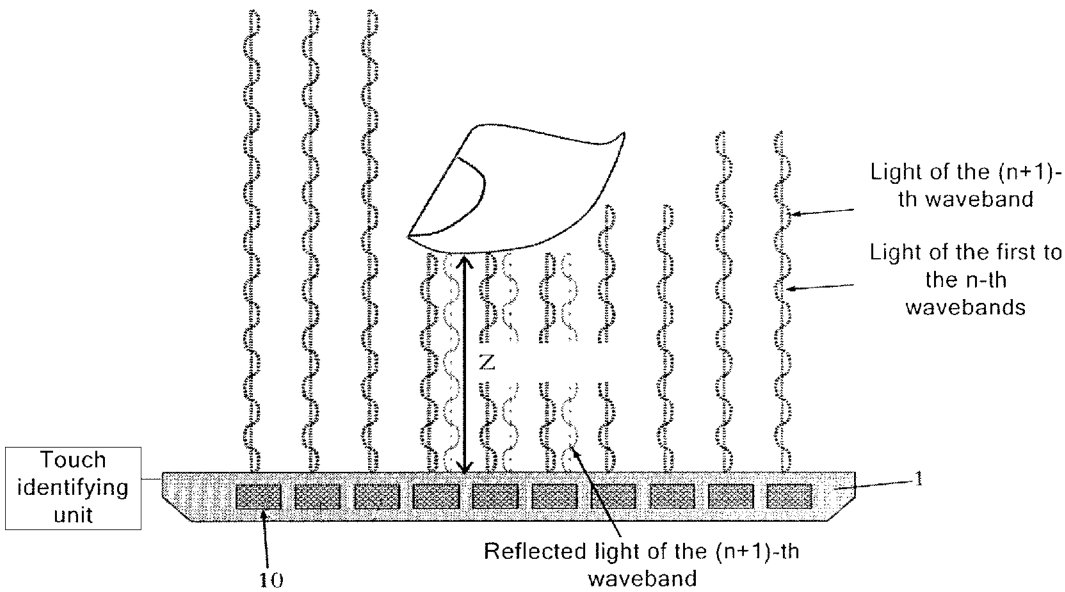
FIG. 1 is a schematic view illustrating that a floating touch display apparatus provided by embodiments of the present disclosure is floatingly touched.
Figure 2:
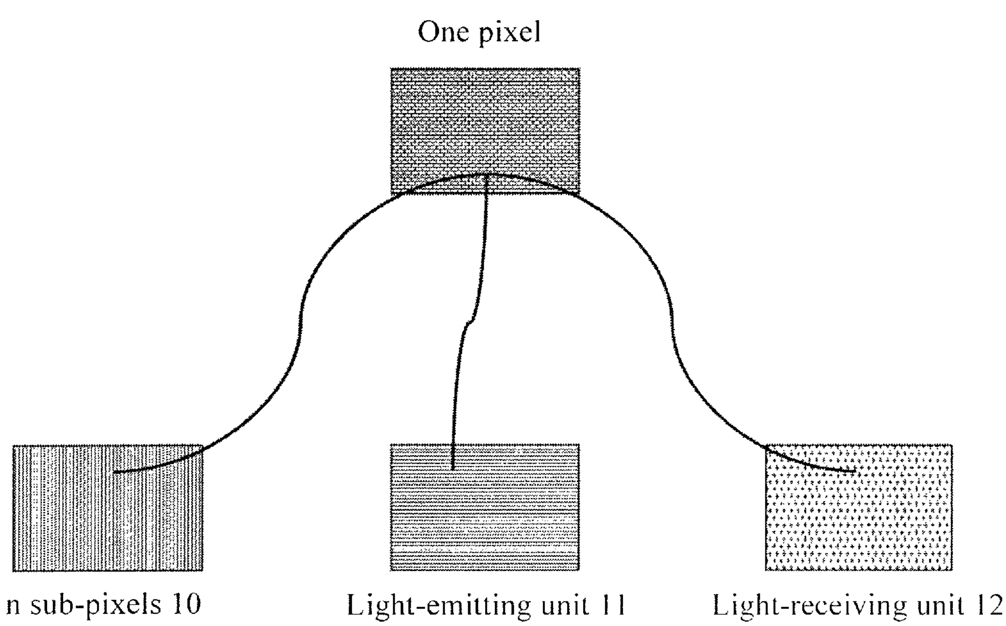
FIG. 2 is a schematic view illustrating a pixel in the floating touch display apparatus shown in FIG. 1.

Embodiments of the present disclosure provide a floating touch display apparatus. FIG. 1 is a schematic view illustrating that the floating touch display apparatus provided by the embodiments of the present disclosure is touched; FIG. 2 is a schematic view illustrating each pixel in the floating touch display apparatus shown in FIG. 1. As shown in FIG. 1 and FIG. 2, the floating touch display apparatus comprises a display panel 1 comprising a plurality of pixels, each pixel of the display panel 1 includes n sub-pixels 10, and the n sub-pixels respectively emit light having wavelengths in a first to an n-th wavebands to display an image. For example, n=3, i.e., each pixel includes three sub-pixels 10; for example, the three sub-pixels 10 emit red, green and blue light, respectively.

In the embodiments of the present disclosure, the floating touch display apparatus further comprises a plurality of light-emitting units 11 and a plurality of light-receiving units 12 which are provided in the display panel 1, and a touch identifying unit. For example, each pixel includes the light-emitting unit 11 and the light-receiving unit 12.

The light-emitting unit 11 is configured for emitting light having a wavelength in a (n+1)-th waveband, and wavelength ranges of the light in the first to (n+1)-th wavebands do not coincide with each other; in other words, the wavelength range of the light in the (n+1)-th waveband is different from the wavelength range of the light in the first to n-th wavebands. For example, in a case where each pixel includes three sub-pixels 10 and the three sub-pixels 10 respectively emit red, green and blue light, the light emitted by the light-emitting unit 11 is not red, green or blue light. For example, the light in the (n+1)-th waveband emitted by the light-emitting unit 11 is an invisible light, so as to prevent the light for display emitted by respective sub-pixels from being affected by the light in the (n+1)-th waveband and to prevent the display quality from being affected. For example, the invisible light includes a ultraviolet light and an infrared light. For example, the light in the (n+1)-th waveband is the infrared light because radiation of the infrared light on a human body is less harmful than that of the ultraviolet light.

The light-receiving unit 12 is configured for receiving the light in the (n+1)-th waveband and generating a touch identifying signal; and the touch identifying unit identifies the floating touch operation according to the touch identifying signal generated by each light-receiving unit 12; for example, a vertical distance Z between a finger of a user and a screen of the display apparatus, an action of the finger and so on are identified.

Figure 3:
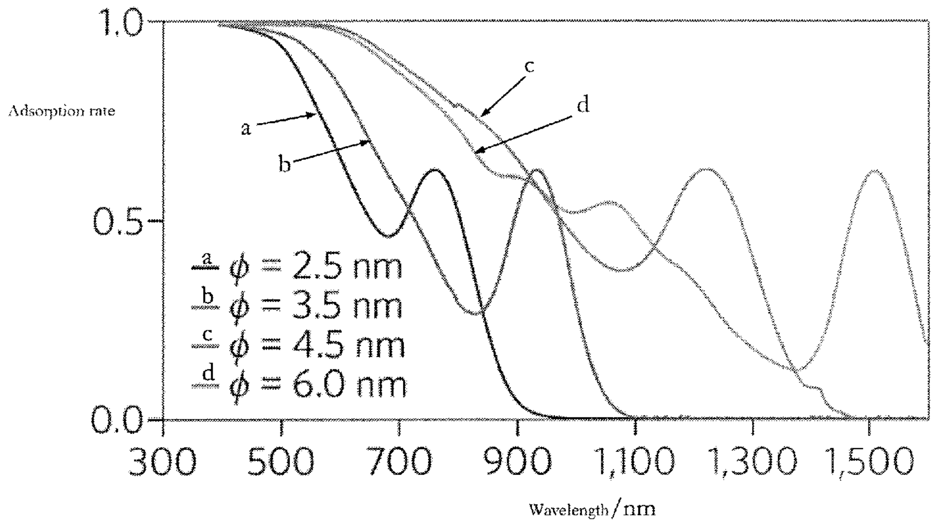
FIG. 3 is a schematic view illustrating absorption rates of quantum dots having different particle sizes on light in respective wavebands.

Quantum dot has properties such as electroluminescence, photoluminescence photoelectric conversion and so on. Moreover, by changing a size and/or a chemical composition of the quantum dot, the quantum dot emits light having different colors upon being irradiated with light or applied with a voltage. Taking a CdTe quantum dot as an example, in the case that the particle size thereof grows from 2.5 nm to 4.0 nm, the waveband of light emitted by the CdTe quantum dot is changed from 510 nm to 660 nm; and further, in the case that the particle size thereof is further increased, the CdTe quantum dot emits the infrared light, and a width of an emission spectrum thereof is very narrow. In another aspect, an absorption rate of the quantum dot on light having specific color is adjusted as well by changing the size of the quantum dot; for example, by controlling the size of the quantum dot, the quantum dot will have a high absorption rate on the infrared light in a specific wavelength range. In FIG. 3, absorption rates of quantum dots having different particle sizes on light in respective wavebands are illustrated.

In the embodiments of the present disclosure, for example, the light-emitting unit 11 and the light-receiving unit 12 are both formed by the quantum dot. For example, the light-emitting unit 11 includes a first quantum dot 110, and the light-receiving unit 12 includes a second quantum dot 120; the first quantum dot 110 emits light in the (n+1)-th waveband upon being irradiated with light or applied with a voltage, and the light in the (n+1)-th waveband for example is continuous; and the second quantum dot 120 absorbs the light in the (n+1)-th waveband to covert the light to an electrical signal serving as the touch identifying signal. Thus, the touch identifying unit performs comparison (e.g., a position where the electrical signal is increased is determined, etc.), to identify the floating touch operation. It should be understood that, in the case that the user's finger simultaneously performs multi touches on the floating touch display apparatus, the touch identifying unit identifies changes of electrical signals at multiple positions at the same time, so as to accurately identify positions of the multiple touches and corresponding touch operations. that is, the identification of the multiple touches is realized.

Figure 4:
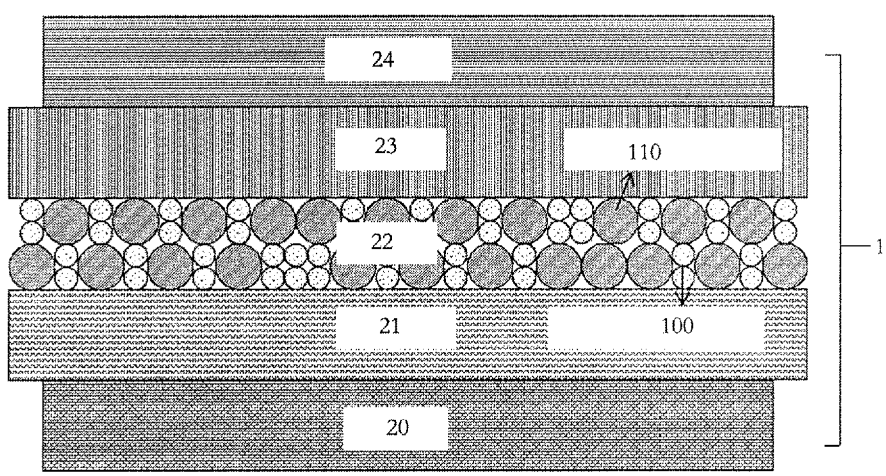
FIG. 4 is a structural schematic view illustrating a quantum dot display apparatus.

In the embodiments of the present disclosure, the floating touch display apparatus for example is a quantum dot display apparatus and comprises the display panel 1. As shown in FIG. 4, the display panel 1 includes an anode layer 20, a hole transport layer 21, a quantum dot layer 22, an electron transport layer 23 and a cathode layer 24 which are provided sequentially. For example, the quantum dot layer 22 includes a quantum dot 100 for implementing display in each sub-pixel 10, and the first quantum dot 110 and the second quantum dot 120; that is to say, the first quantum dot 110 and the second quantum dot 120 are provided in a same layer with the quantum dot 100 of each sub-pixel, which simplifies the structure of the display apparatus and reduces the thickness of the display apparatus. For example, a voltage is applied to the anode layer 20 and the cathode layer 24, so that the quantum dot layer 22 emits light; the quantum dots of the sub-pixels emit light in the first to the n-th wavebands, and the first quantum dot emits light in the (n+1)-th waveband.

Of course, the quantum dot display apparatus for example employs a photoluminescent mode, i.e., the floating touch display apparatus not only comprises the display panel described above, but also comprises a backlight; and the backlight is configured for emitting light to the display panel. The quantum dot 100 in the display panel generates light in the first to an n-th wavebands according to the light emitted by the backlight, and the quantum dot 110 in the display panel generates light in the (n+1)-th waveband according to the light emitted by the backlight.

Figure 5:
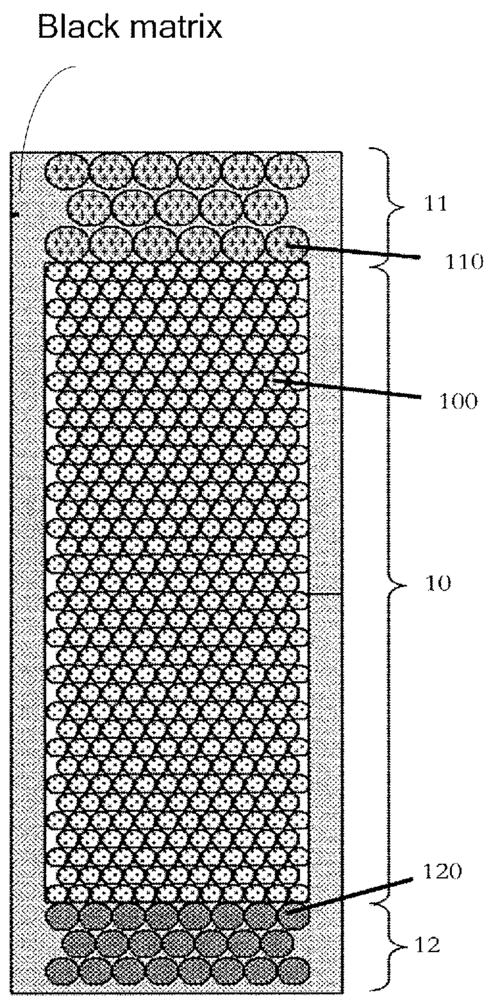
FIG. 5 is a schematic view illustrating that a sub-pixel in the case that a first quantum dot and a second quantum dot are located in a region corresponding to a black matrix.

For example, as shown in FIG. 5, the first quantum dot 110 and the second quantum dot 120 are located in a region corresponding to a black matrix of the display panel; particularly in a case where the light in the (n+1)-th waveband is the infrared light, the infrared light does not have a large loss upon passing the black matrix so that the black matrix does not affect the emission of the light in the (n+1)-th waveband. The display is affected by providing the first quantum dot 110 and the second quantum dot 120 in the region corresponding to the black matrix. For example, widths of the first quantum dot 110 and second quantum dot 120 are substantially within a width range of the black matrix, so as not to reduce an aperture ratio of the display panel 1.

Figure 6:
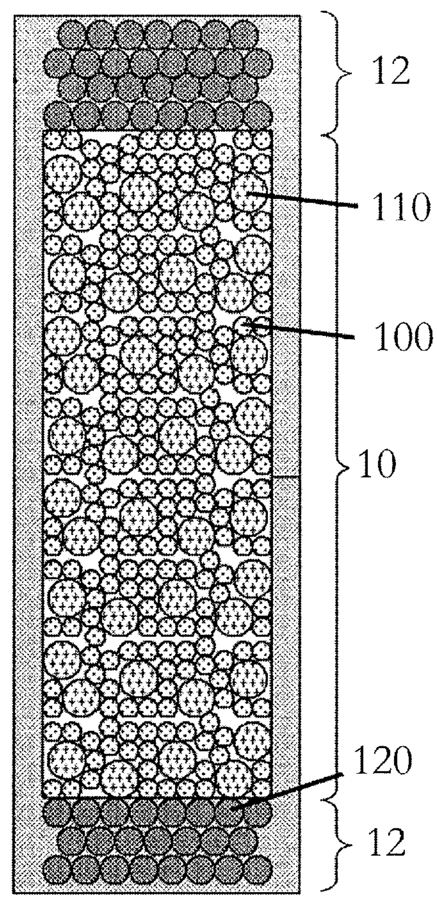
FIG. 6 is a schematic view illustrating the sub-pixel in the case that the first quantum dot is located in an opening region of the sub-pixel and the second quantum dot is located in the region corresponding to the black matrix.

For example, the first quantum dot 110 and/or the second quantum dot 120 are provided in the sub-pixel 10, i.e., the first quantum dot 110 and/or the second quantum dot 120 and the quantum dot 100 of the sub-pixel 10 are provided in an opening region of the sub-pixel in a mixing mode. For example, as shown in FIG. 3 and FIG. 6, the first quantum dot 110 and the quantum dot 100 are provided in the opening region of the sub-pixel 10 in a mixing mode, and the second quantum dot 120 is provided in the region corresponding to the black matrix around the sub-pixel 10.

Figure 7:
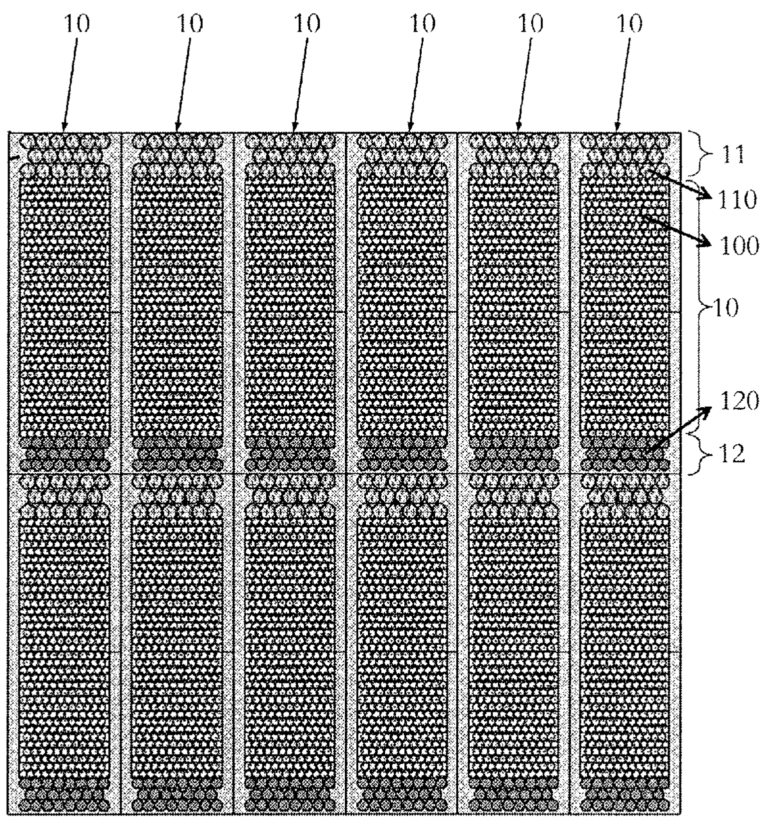
FIG. 7 is a schematic view illustrating that both the light-emitting unit and the light-receiving unit are provided in each sub-pixel.
Figure 8:
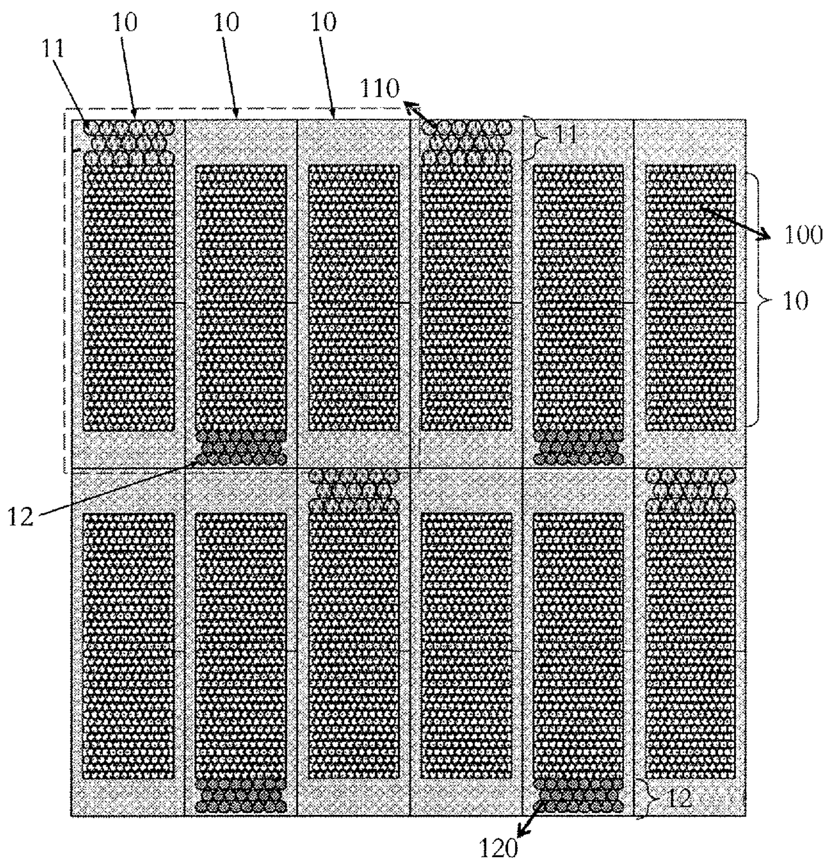
FIG. 8 is a schematic view illustrating that only one light-emitting unit and one light-receiving unit are included in each pixel.

In the embodiments of the present disclosure, the light-emitting unit 11 and the light-receiving unit 12 are provided in each pixel, so that the floating touch display apparatus has high touch accuracy, and the smallest display unit (i.e. a pixel point (the pixel)) is identified. For example, in the pixel, the light-emitting unit 11 is provided in a region corresponding to the black matrix around at least one sub-pixel, and the light-receiving unit 12 is provided in a region corresponding to the black matrix around at least one sub-pixel. For example, as shown in FIG. 8, in n sub-pixels (three sub-pixels in the drawing) included in each pixel (a region enclosed by dashed lines), only one light-emitting unit 11 and one light-receiving unit 12 are provided. Of course, the light-emitting unit 11 and the light-receiving unit 12 in the pixel for example are provided in a manner as follows: the light-emitting unit 11 and the light-receiving unit 12 are provided in the region corresponding to the black matrix around each sub-pixel, as shown in FIG. 7.

It should be noted that, in the embodiments of the present disclosure, in a case where a requirement on touch accuracy is not high, the light-emitting unit 11 and the light-receiving unit 12 for example are provided in part of the pixels, the light-emitting unit 11 and the light-receiving unit 12 for example are not provided in a same pixel, each light-emitting unit 11 for example corresponds to several light-receiving units 12, and each light-receiving unit 12 for example corresponds to several light-emitting units 11.

It should be noted that, in the embodiments of the present disclosure, besides the quantum dot display apparatus, the floating touch display apparatus for example is an OLED display apparatus, a liquid crystal display (TFT-LCD), or other electroluminescent or photoluminescet display apparatuses. In this case, the first quantum clot 110 is still used as the light-emitting unit 11 and the second quantum dot 120 is still used as the light-receiving unit 12; but it should be understood that, in this case, it is required that the first quantum dot 110 and the second quantum dot 120 form a additional layer of the display panel 1, that is, as compared with the ordinary OLED display apparatus and TFT-LCD, at least one layer of the first quantum dot 110 and the second quantum dot 120 is added. At the same time, as compared with the quantum dot display apparatus described above, the light-emitting unit 11 and the light-receiving unit 12 must be provided in the region corresponding to the black matrix of the display panel, and cannot be located in the opening region of the pixel.

It should be further noted that, in the embodiments of the present disclosure, the light in the (n+1)-th waveband is continuous light, or is pulsed light. In the case that the light in the (n+1)-th waveband is the pulsed light, a time difference between the emission of the light-emitting unit 11 and the receiving of the light-receiving unit 12 is employed to calculate a distance between the finger and the screen, and an action of the finger is identified as the touch operation and is responded in the case that the distance between the finger and the screen is within a predetermined range.

In the floating touch display apparatus provided by the embodiments of the present disclosure, the light-emitting unit 11 and the light-receiving unit 12 are provided in the display panel 1, the light-emitting unit 11 emits light in a specific waveband, and the light emitted by the light-emitting unit 11 is received by the light-receiving unit 12 after being reflected by the finger of the user, and is converted to the touch identifying signal, and then the touch identifying unit identifies the touch position and the touch action according to the touch identifying signal, so as to identify the action of the finger having a certain distance from the screen as the touch operation. In this way, the floating touch display apparatus has strong floating touch capability, and meanwhile, touch identification of high accuracy is realized by arranging the plurality of light-emitting units 11 and the plurality of light-receiving units 12 in the display panel 1, and the light-emitting unit 11 and the light-receiving unit 12 are provided in the display panel 1 so that weight and thickness of the floating touch display apparatus are not increased greatly.

The foregoing embodiments merely are exemplary embodiments of the present disclosure, and not intended to define the scope of the present disclosure, and the scope of the disclosure is determined by the appended claims.

The present application claims priority of Chinese Patent Application No. 201510691498.5 filed on Oct. 22, 2015, the disclosure of which is incorporated herein by reference in its entirety as part of the present application.

The invention claimed is:

1. A floating touch display apparatus, comprising:

a display panel, comprising:

- a plurality of pixels, each pixel of the display panel including n sub-pixels, and the n sub-pixels respectively emitting light having wavelengths in a first to an n-th wavebands to display and image, n being an integer greater than zero;
- a plurality of light-emitting units, wherein each light-emitting unit is configured for emitting light having a wavelength in a (n+1)-th waveband, and wavelength ranges of the light in the first to the (n+1)-th wavebands do not coincide;
- a plurality of light-receiving units, wherein each light-receiving unit is configured for receiving the light in the (n+1)-th waveband and generating a touch identifying signal; and a touch identifying unit, wherein the touch identifying unit identifies a floating touch action according to the touch identifying signal generated by the light-receiving unit, wherein, the light-emitting unit includes first quantum dots, which emit the light in the (n+1)-th waveband upon being irradiated with light or applied with a voltage;

the light-receiving unit includes second quantum dots, and each of the second quantum dots itself absorbs the light in the (n+1)-th waveband and itself converts the light to an electrical signal serving as the touch identifying signal;

the touch identifying unit identifies the floating touch action according to the electrical signal;

the display panel is a quantum dot display panel, the quantum dot display panel comprises an anode layer, a cathode layer, and a quantum dot layer between the anode layer and the cathode layer, and the quantum dot layer comprises quantum dots for implementing display in each of the n sub-pixels; and in an opening region, which is surrounded by a black matrix of the display panel, of a first sub-pixel among the n sub-pixels, the first quantum dots and/or the second quantum dots are mixed with the quantum dots for implementing display.

2. The floating touch display apparatus according to claim 1, wherein, the light having the wavelength in the (n+1)-th waveband is an invisible light.

3. The floating touch display apparatus according to claim 2, wherein, the light having the wavelength in the (n+1)-th waveband is an infrared light.

4. The floating touch display apparatus according to claim 1, wherein, in a second sub-pixel among the n sub-pixels, the first quantum dots and the second quantum dots are located in a region corresponding to the black matrix of the display panel.

5. The floating touch display apparatus according to claim 4, wherein, in the second sub-pixel among the n sub-pixels, the first quantum dots and the second quantum dots are provided in a same layer with the quantum dots for implementing display.

6. The floating touch display apparatus according to claim 1, wherein, the light-emitting unit and the light-receiving unit are provided in each pixel.

7. The floating touch display apparatus according to claim 1, wherein, the display panel includes the anode layer, a hole transport layer, the quantum dot layer, an electron transport layer and the cathode layer which are provided sequentially.

8. The floating touch display apparatus according to claim 1, wherein, the light-emitting unit and the light-receiving unit are provided in part of the pixels.

9. The floating touch display apparatus according to claim 1, wherein, the light-emitting unit and the light-receiving unit are not provided in a same pixel.

10. The floating touch display apparatus according to claim 1, wherein, each light-emitting unit corresponds to several light-receiving units.

11. The floating touch display apparatus according to claim 1, wherein, each light-receiving unit corresponds to several light-emitting units.

12. The floating touch display apparatus according to claim 1, wherein, in the opening region, which is surrounded by the black matrix of the display panel, of the first sub-pixel among the n sub-pixels, both of the first quantum dots and the second quantum dots are mixed with the quantum dots for implementing display.

* * * * *